(12) United States Patent
Arasawa (10) Patent No.: US 7,644,324 B2
(45) Date of Patent: Jan. 5, 2010

(54) SEMICONDUCTOR MEMORY TESTER (75) Inventor: Hisaki Arasawa, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 290 days.

(21) Appl. No.: 11/819,025

(22) Filed: Jun. 25, 2007

(65) Prior Publication Data
US 2007/0297255 A1 Dec. 27, 2007

(30) Foreign Application Priority Data
Jun. 26, 2006 (JP) .............................. 2006-175545

(51) Int. Cl.
G11C 29/00 (2006.01)

(52) U.S. Cl. ................ 714/718; 714/5; 714/8; 714/25; 714/30; 714/42; 714/719; 714/721; 714/731; 714/736; 714/744; 714/745

(58) Field of Classification Search ........................ None
See application file for complete search history.

(56) References Cited

U.S. PATENT DOCUMENTS 6,421,291 B1 * 7/2002 Watanabe et al. ........... 365/219
6,556,492 B2 * 4/2003 Ernst et al. .................. 365/201
6,754,868 B2 * 6/2004 Bristow et al. .............. 714/744
6,871,306 B2 * 3/2005 Ernst et al. .................. 714/718
7,003,697 B2 * 2/2006 Magliocco .................... 714/25
7,036,053 B2 * 4/2006 Zumkehr et al. ............ 714/709
7,100,099 B2 * 8/2006 Niijima ....................... 714/744
7,117,404 B2 * 10/2006 Ernst et al. .................. 714/718
7,197,682 B2 * 3/2007 Niijima ....................... 714/731
2002/0003433 A1 * 1/2002 Housako ..................... 324/765
2002/0010877 A1 * 1/2002 Ernst et al. .................... 714/25
2003/0005359 A1 * 1/2003 Magliocco .................... 714/25
2003/0191995 A1 * 10/2003 Abrosimov et al. ......... 714/719
2003/0233604 A1 * 12/2003 Lin et al. ..................... 714/718

FOREIGN PATENT DOCUMENTS

JP 2002-230999 A 8/2002

* cited by examiner

Primary Examiner—John P Trimmings
(74) Attorney, Agent, or Firm—Westerman, Hattori, Daniels & Adrian, LLP (57) ABSTRACT There is implemented a semiconductor memory tester capable of efficiently conducting a test on a fast memory by programming according to parameters of a device without being attended by complex program handling. The semiconductor memory tester for determining pass/fail on a memory device under test is characterized in comprising a measurement division for comparing an output from the memory device under test with an expected value at timing on the basis of a clock outputted by the memory device under test.

4 Claims, 9 Drawing Sheets

SEMICONDUCTOR MEMORY TESTER

FIELD OF THE INVENTION

The invention relates to a semiconductor memory tester, and more particularly, to an improvement on a test for a DDR SDRAM (Double Data Rate Synchronous Dynamic Random Access Memory).

BACKGROUND OF THE INVENTION

A DDR SDRAM having a high-speed data transfer function called a double data rate (DDR) mode is a kind of semiconductor memories, used for a main memory of a computer.

The SDRAM is a DRAM made up such that its interface with an external bus is operated in sync with a clock signal at a fixed cycle. Since the DRAM is made up so as to enable electrical charge to be stored by means of capacitors and transistors, read/write can be freely executed, however, as the electrical charge for storing information will discharge with time, rewriting (refresh) for holding memory content is executed at intervals of a fixed time length. When the computer is turned off, the memory content is erased.

In the DDR mode, a transfer rate of the SDRAM is increased twice as fast as a normal rate. More specifically, synchronous timing is reinforced so as to enable read/write of data to be executed at both the rising edge of, and the falling edge of the clock signal for providing synchronization between a CPU and memories within the computer.

With the DDR SDRAM, there has since been adopted a technique whereby presence of data is notified to the opposite party on the premise that a differential data strobe (DQS) is effective, the technique has hardly had effectively functioned until DDR2. The reason for this is because a clock has been relative low in speed, and testing on data and DQS has been easily conducted on the basis of the clock.

In contrast, in the case of an interface of an SDRAM handling high-speed data, such as a DDR3, DDR-DRAM of the next generation, frequency of a clock fed from a tester is multiplied within a semiconductor memory, serving as a test target or device under test (hereinafter referred to as DUT), by use of, for example, a PLL (Phase Locked Loop) to thereby generate a high speed clock (or example, a reference clock at 133 MHz is multiplied by a factor of 24 within a device to thereby obtain one at 3200 MHz), the interior of the DUT is driven with the use of the clock at a higher speed, and further, in order to provide operation timing inside the DUT, clock matching is executed by use of a DLL (Delay Locked Loop), and so forth.

In JP 2002-230999 A described hereunder, there has been described the structure of a DDR SDRAM, and a test thereon.

With a common tester for conducting a test on those conventional DDR SDRAMs, a time for an input signal from the DUT is set on the basis of a reference timing inside the tester, and by sampling the input signal, and carrying out logical comparison of values thereof, determination on pass/fail is made. This is based on the premise that the DUT is operated in complete sync with basic timing (a clock) fed from the tester.

Figure 8:
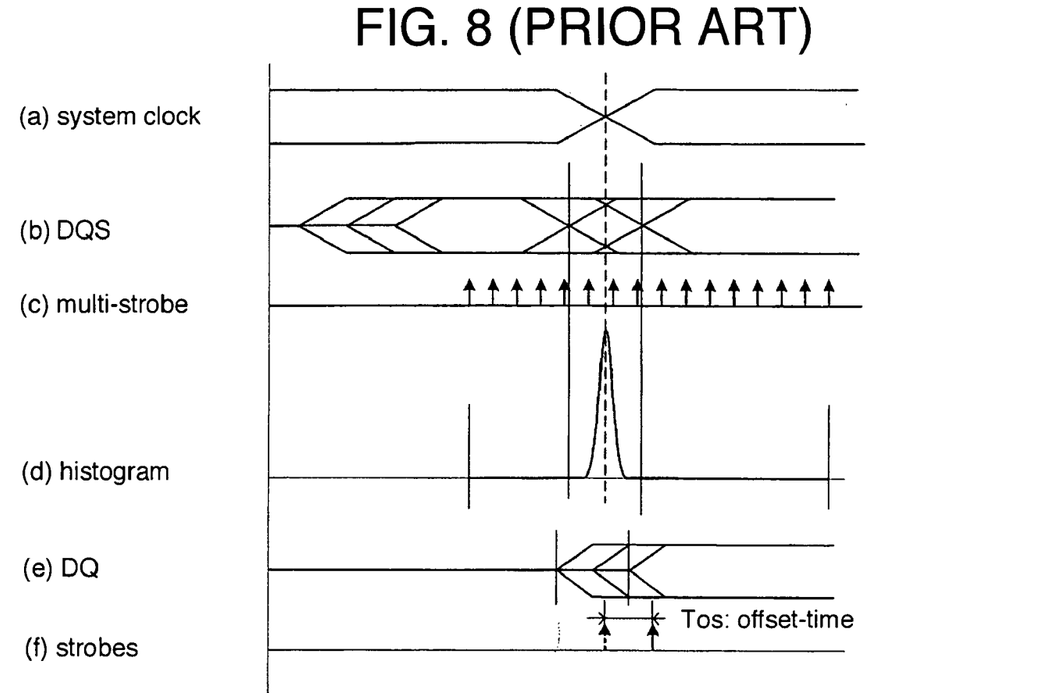
FIG. 8 is an example of a timing chart of DDR SDRAM.

FIG. 8 is an example of a timing chart of the DDR SDRAM described. In the figure, symbol (a) indicates a system clock generated in the DUT, based on a reference clock inputted from the tester. Symbol (b) indicates a differential data strobe (DQS) outputted from the DUT. Symbol (c) indicates a multi-strobe consisting of a plurality of strobes (in the case of the example, in FIG. 8, 16 strobes), which is a strobe for probing whereabouts of a transition point of DQS. Symbol (d) indicates a histogram, which is found by sampling DQS with the multi-strobe. The transition point of DQS is identified as "somewhere hereabout" on the basis of a peak position in the histogram. Symbol (e) indicates data DQ outputted from the DUT. Symbol (f) indicates strobes for use in sampling DQ, executing operation for adding offset-time Tos required by the device to the peak position in the histogram.

Figure 9:
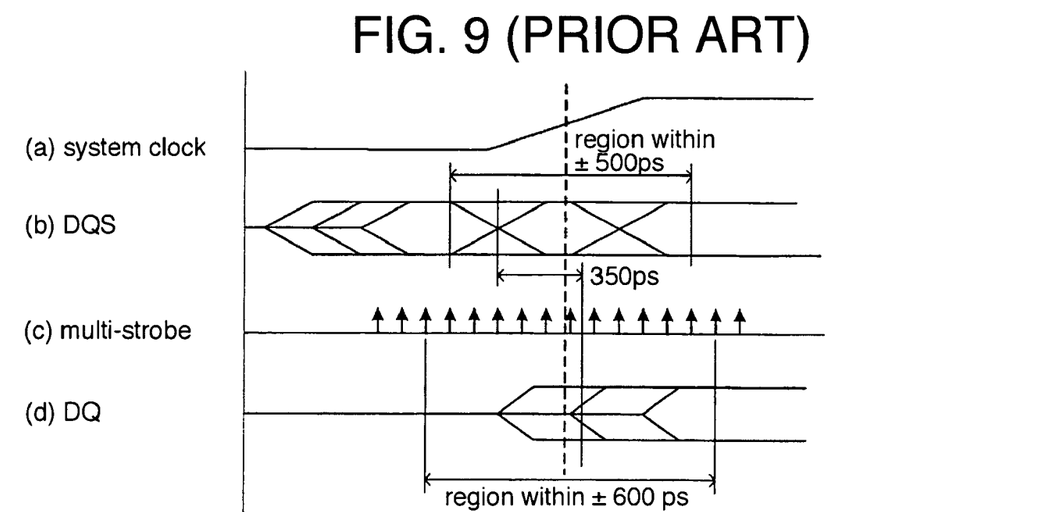
FIG. 9 is an example of a timing chart of DDR2-400.

FIG. 9 is an example of a timing chart of DDR2-400. In the figure, parts corresponding to those in FIG. 8 are denoted by like reference numerals. In the figure, symbol (a) indicates a system clock generated in the DUT, (b) indicates the differential data strobe (DQS) outputted from the DUT, (c) indicates the multi-strobe, and (d) indicates data DQ outputted from the DUT. A region within ±500 ps centering around the transition point of the system clock is defined as a significant region of the differential data strobe (DQS), 350 ps from a crossover point of the differential data strobes DQSs is defined as a strobe position of the data DQ, and a region within ±600 ps centering around rising of the system clock is defined as a significant region of the data DQ.

Figure 10:
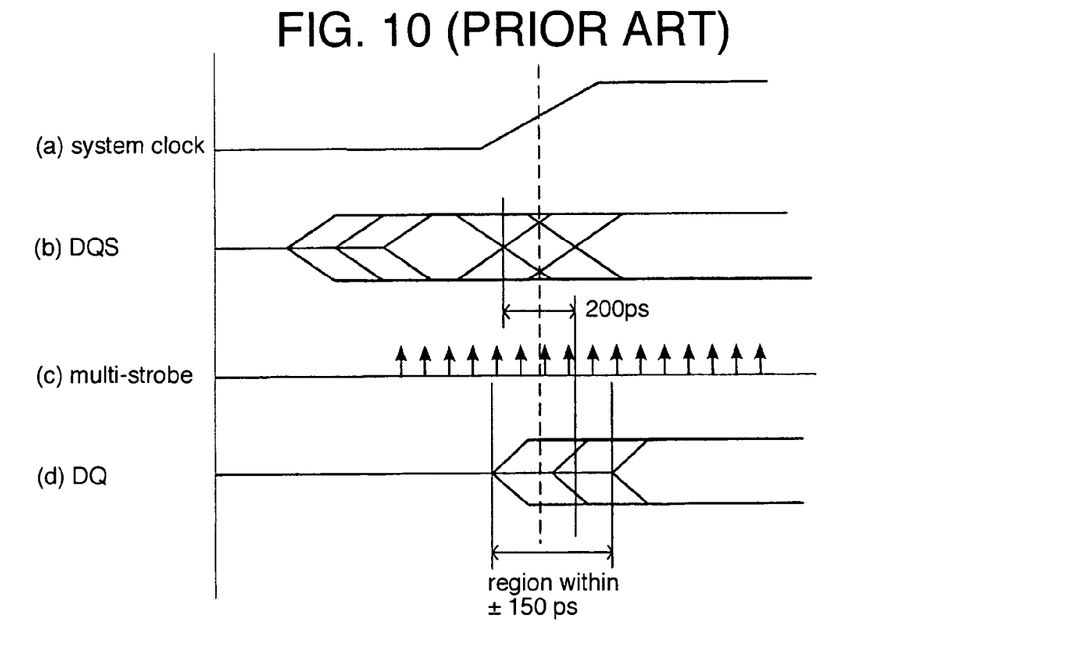
FIG. 10 is an example of a timing chart of DDR3-800.

FIG. 10 is an example of a timing chart of DDR3-800. In the figure, parts corresponding to those in FIG. 9 are denoted by like reference numerals. In FIG. 10, 200 ps from a crossover point of the differential data strobes DQSs is defined as a strobe position of the data DQ, and a region within ±150 ps centering around rising of the system clock is defined as a significant region of the data DQ.

Figure 11:
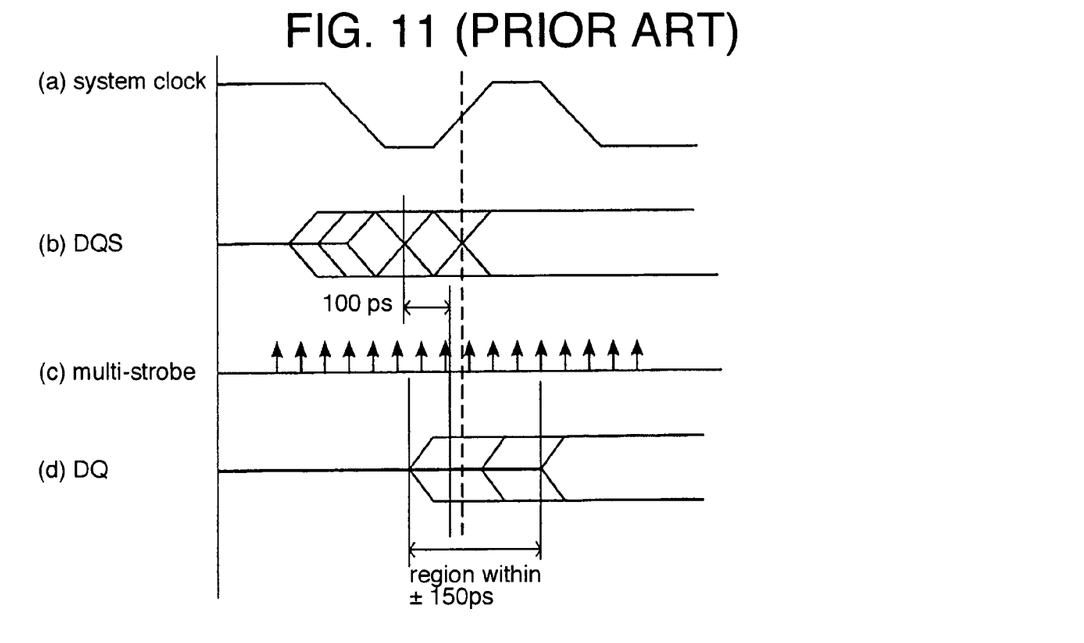
FIG. 11 is an example of a timing chart of DDR3-1600.

FIG. 11 is an example of a timing chart of DDR3-1600. In the figure, parts corresponding to those in FIGS. 9, and 10, respectively, are denoted by like reference numerals. In FIG. 11, 100 ps from a crossover point of the differential data strobes DQSs is defined as a strobe position of the data DQ, and a region within ±150 ps centering around rising of the system clock is defined as a significant region of the data DQ.

However, it is difficult to accurately maintain a positional relationship of an internally generated high-speed clock with the clock inputted from the tester at all times, and in some cases, a positional relationship between the differential data strobe DQS, and the data DQ can be reversed in sequence.

Furthermore, workings of the PLL, and the DLL will vary depending on environmental conditions of the device, such as circuit noises, variation in power supply, device temperature, and so forth, thereby causing a change in frequency and propagation delay. As a result, in the case of burst-read of a long data (row) exceeding 1 kbit, it will become impossible to maintain a given relationship with the clock being fed from the tester.

SUMMARY OF THE INVENTION

Accordingly, in order to find the transition point of DQS, as previously described, the conventional tester is programmed to run a program different from that for a proper test on DRAM to thereby acquire the data, however, time required for this becomes about 5 minutes against total test time on the order of 40 minutes, so that time representing not less than 10% of the total test time is required.

Further, as described in the foregoing, because a strobe interval of the multi-strobe is rather large, falling in a range of 20 to 100 ps, there is the need for operation to shift a strobe generation point little by little upon determining minuscule time, which is time-consuming, and data thus obtained being frequency data in the strict sense, the data cannot be accurate.

Furthermore, the data is sampled once, but there is no guarantee that subsequent operations of the device will be constant, so that even if fail is detected with a tester executing measurements at fixed timing, there is a possibility that no problem exists in protocol between an actual memory and the DUT, and therefore, there arises a chance of a conforming product being determined as a defect product. The higher the data rate, the stronger this tendency will be.

In order to overcome those inconveniences, a user has to program such that a provisional pattern is run to execute acquisition of data, and offset-time is generated to implement correction of timing for the whole although the user wants to conduct testing only on time when DQ is established against DQS, thus posing a problem that complication of a tester program is unavoidable.

It is therefore an object of the invention to provide a semiconductor memory tester capable of efficiently conducting a test on a fast memory by programming according to parameters of a device without being attended by complex program handling.

In one aspect of the invention, there is provided a semiconductor memory tester for determining pass/fail on a DUT, said semiconductor memory tester comprising a measurement division for comparing an output from the DUT with an expected value at timing on the basis of a clock outputted by the DUT.

The measurement division preferably comprises comparators for receiving output data of the DUT, respectively, sampling units for sampling respective outputs from the comparators at timing for comparison, respectively, and fail detectors for comparing respective outputs of the sampling units with the expected value, respectively, before determining pass/fail on the DUT.

The measurement division preferably comprises variable delay elements for setting delay time of the output data of the DUT, respectively.

The measurement division preferably comprises a frequency dividing means for frequency-dividing the clock outputted by the DUT to thereby generate the timing for the comparison.

The DUT may internally generates the clock.

With the semiconductor memory tester according to the invention, testing on the fast memory can be efficiently conducted without being attended by the complex program handling as in the past.

PREFERRED EMBODIMENTS OF THE INVENTION

Preferred embodiments of the invention are described hereinafter with reference to the accompanying drawings.

Figure 1:
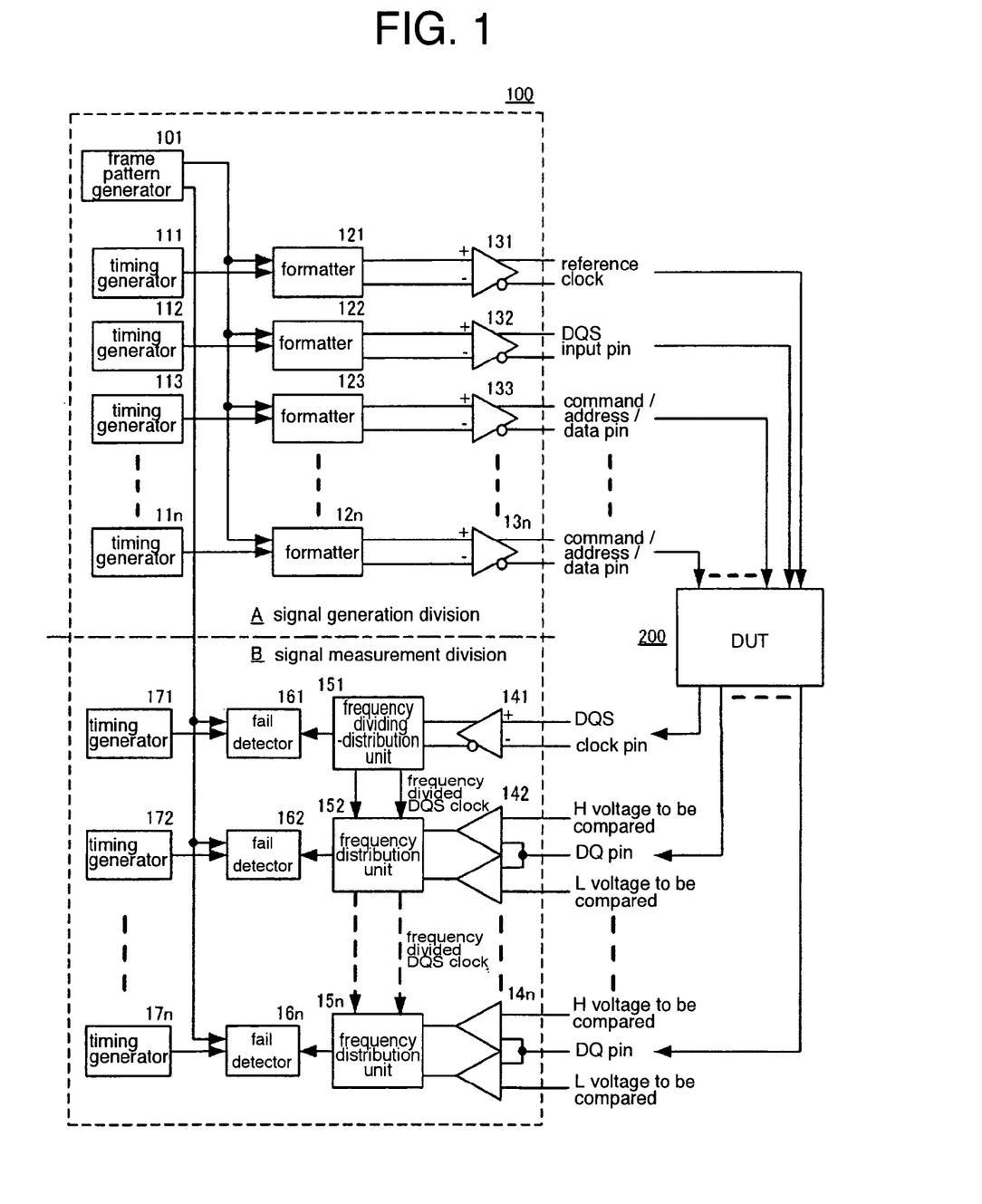
FIG. 1 is a block diagram showing one embodiment of the invention.

FIG. 1 is a block diagram showing one embodiment of the invention. In the figure, a tester 100 provides a DUT 200 with various test signals, and the DUT 200 outputs response signals based on the test signals inputted by the tester 100 to the tester 100. The tester 100 decides whether or not the response signals inputted from the DUT 200 meets a predetermined time-relation as pre-set before making a determination on pass/fail.

The tester 100 can be broadly divided into a signal generation division A and a signal measurement division B.

The signal generation division A is provided with a frame pattern generator 101 for inputting a frame pattern to be given to the DUT 200, as an output frame pattern, to formatters 121 to 12n, and inputting an expected frame pattern outputted from the DUT 200, serving as a criterion for pass/fail decision, as an input frame pattern, to fail detectors of the signal measurement division B, a reference clock output system comprising a timing generator 111, the formatter 121, and a driver 131, a DQS input pin output system comprising a timing generator 112, a formatter 122, and a driver 132, and a plurality of output systems of command/address/data pin, for outputting a predetermined packet frame, comprising timing generators 113 to 11n, formatters 123 to 12n, and drivers 133 to 13n, respectively.

The signal measurement division B is provided with a DQS clock pin system comprising a receiver 141, a frequency dividing-distribution unit 151, a fail detector 161, and a timing generator 171, and a plurality of DQ measurement systems comprising comparators 142 to 14n, distribution units 152 to 15n, fail detectors 162 to 16n, and timing generators 172 to 17n, respectively.

The timing generators 111 to 11n each output a timing signal of the predetermined time-relation as set according to the respective output signal systems to the respective formatters 121 to 12n, in subsequent steps, respectively.

The formatters 121 to 12n each output a signal formatted in a predetermined signal scheme, such as Return-to-Zero (RZ) or Non-Return to Zero (NRZ), as set according to the respective output signal systems, on the basis of a frame pattern signal inputted from the frame pattern generator 101, and timing signals inputted from the timing generators 111 to 11n, respectively, to the respective drivers 131 to 13n in subsequent steps, respectively. The formatter 121 formats the signal in the signal scheme of a reference clock, the formatter 122 formats the signal in the signal scheme (RZ) of DQS input, and the formatters 123 to 12n each format the signal in the signal scheme (NRZ) for outputting the packet frame of, for example, 6 bit width 18 words, including command/address/data, and an error detection bit.

The drivers 131 to 13n each have a configuration enabling a differential signal to be outputted to a predetermined pin of the DUT 200.

The receiver 141 receives a DQS clock of the DUT 200, in differential form, and outputs a differential signal to the frequency dividing-distribution unit 151.

The frequency dividing-distribution unit 151 divides the DQS clock inputted via the receiver 141 to thereby output a clock to the distribution units 152 to 15n, for the other systems, while outputting the clock to one of input terminals of the fail detector 161.

The timing generator 171 outputs a timing signal to serve as a criterion for determining whether or not the time-relation of the DQS clock outputted from the DUT 200 meets a predetermined specification as represented by the expected frame pattern to the other of the input terminals of the fail detector 161.

The fail detector 161 makes a determination on pass/fail as to an output signal of the frequency dividing-distribution unit 151 on the basis of the expected frame pattern inputted from the frame pattern generator 101, and the timing signal from the timing generator 171.

The comparators 142 to 14n each are made up as a window-type comparator, and checks how an output data DQ of the DUT 200 compares in value to a predetermined upper limit value "H" and a predetermined lower limit value "L", thereby outputting results of comparison to the distribution units 152 to 15n, respectively.

The distribution units 152 to 15n each sample respective output signals from the comparators 142 to 14n on the basis of a clock that is frequency-divided by the frequency dividing-distribution unit 151 to be subsequently outputted to one of input terminals of each of the fail detectors 162 to 16n.

The timing generators 172 to 17n each output a timing signal serving as a criterion for determining whether or not the time-relation of the output data DQ from the DUT 200, sampled by the distribution units 152 to 15n, respectively, meets the predetermined specification as represented by the expected frame pattern to the other of the input terminals of each of the fail detectors 162 to 16n.

The fail detectors 162 to 16n each makes a determination on pass/fail as to the output data DQ from the DUT 200, sampled by the distribution units 152 to 15n, respectively, on the basis of the expected frame pattern inputted from the frame pattern generator 101, and the respective timing signals from the timing generators 172 to 17n.

Figure 2:
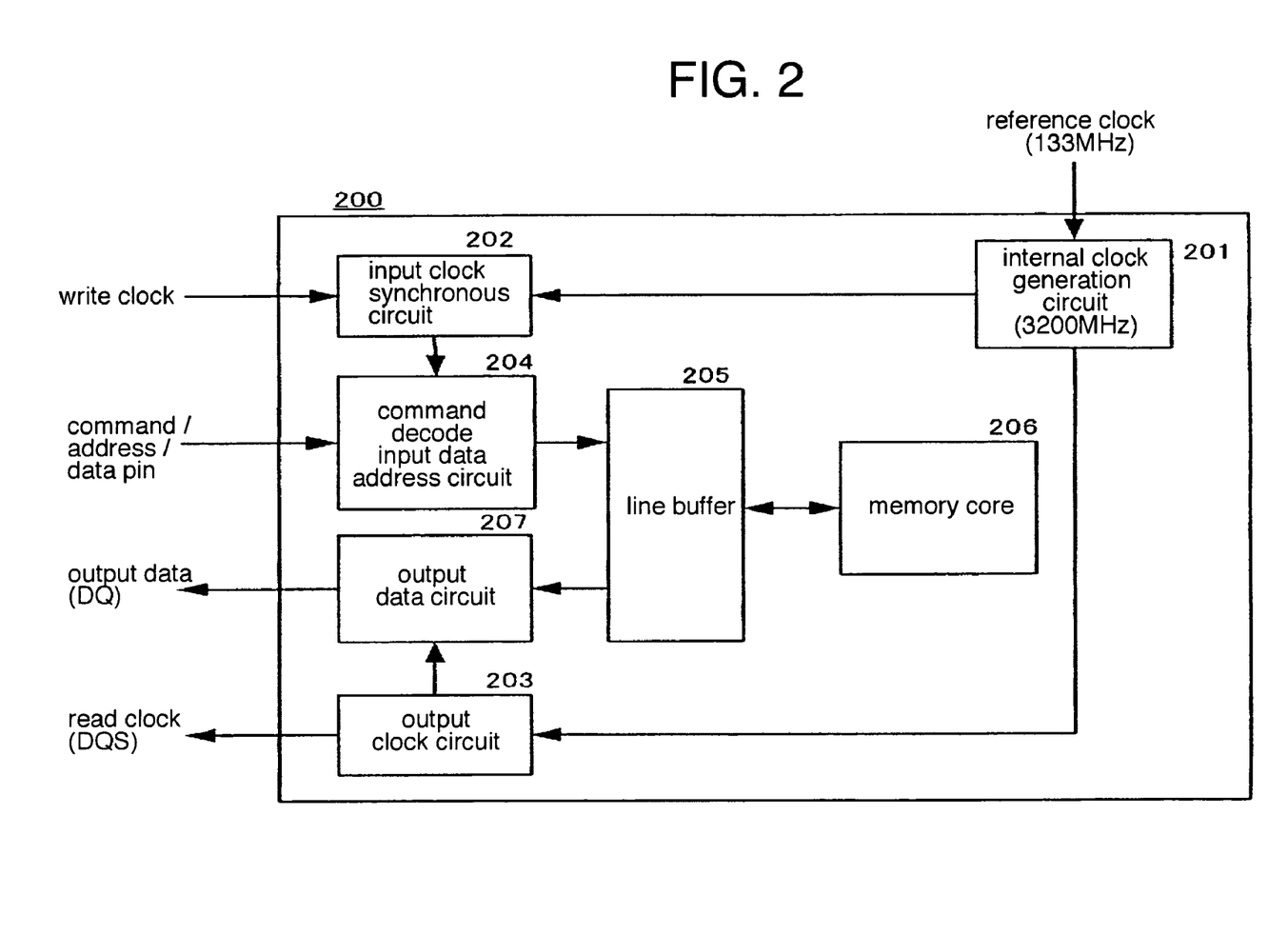
FIG. 2 is a block diagram showing a configuration example of a DUT 200.

FIG. 2 is a block diagram showing a configuration example of the DUT 200.

An internal clock generation circuit 201 multiplies (for example, by a factor of 24) frequency of the reference clock (for example, at 133 MHz) inputted from the tester 100 to thereby generate an internal clock DQS at a predetermined frequency (for example, at 3200 MHz) to be subsequently outputted to one of input terminals of an input clock synchronous circuit 202 and an output clock circuit 203, respectively.

A write clock is inputted to the other of the input terminals of the input clock synchronous circuit 202 to be outputted as the write clock in sync with the internal clock to a command decode input data address circuit 204.

The output clock circuit 203 outputs the internal clock as a read clock to the outside while outputting the read clock to an output data circuit 207 as well.

The command decode input data address circuit 204 fetches the command/address/data, in the form of the packet frame, inputted from the outside, on the basis of the write clock inputted from the input clock synchronous circuit 202, to thereby write the same to a memory core 206 via a line buffer 205.

The data written to the memory core 206 is read out by the output data circuit 207 via the line buffer 205 to be outputted as the output data to the outside on the basis of the read clock outputted from the output clock circuit 203.

Figure 3:
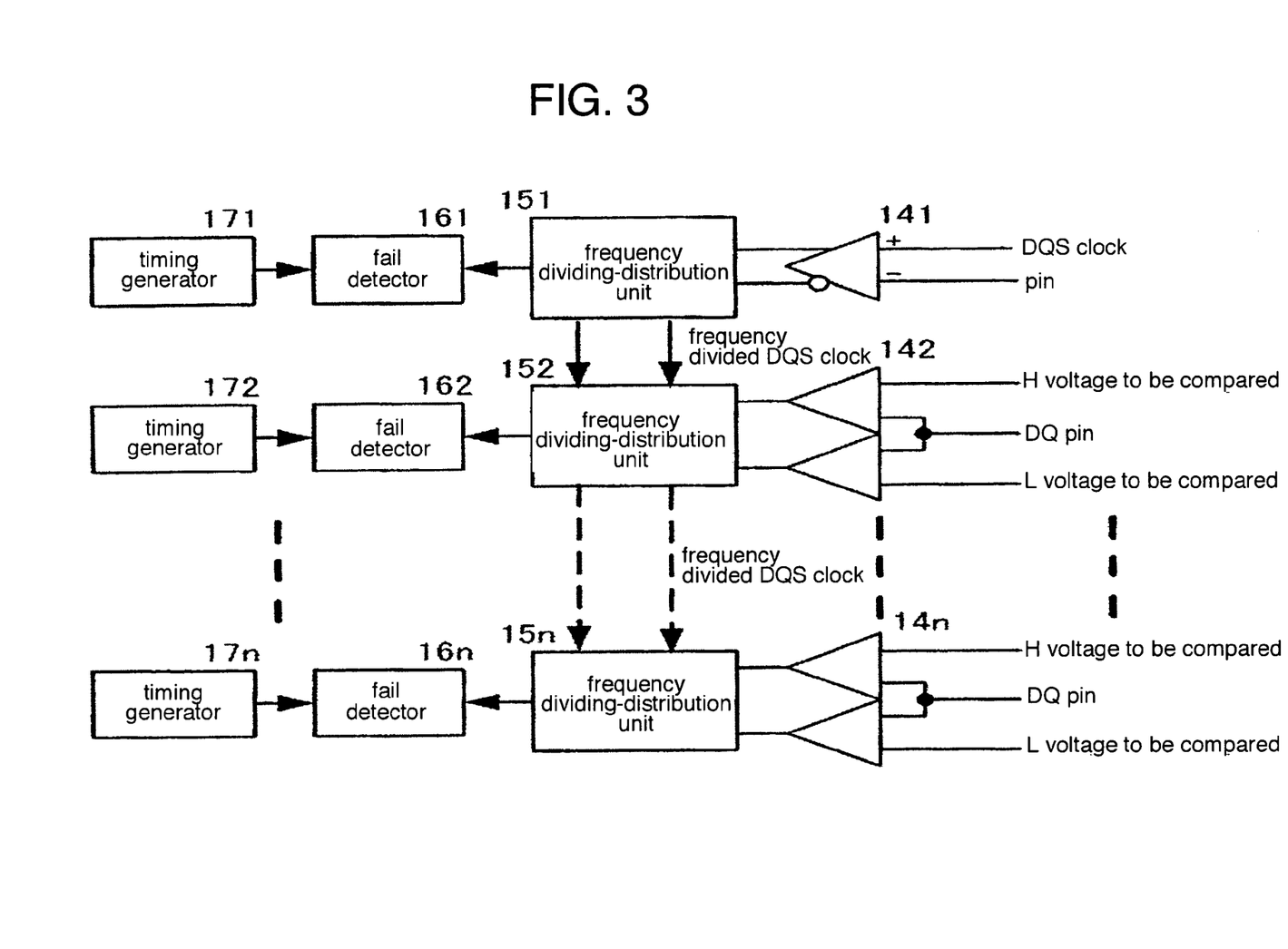
FIG. 3 is a block diagram showing only a signal measurement division B shown in FIG. 1.

FIG. 3 is a block diagram showing only the signal measurement division B shown in FIG. 1. The frequency division of the DQS clock outputted from the DUT 200 by the frequency dividing-distribution unit 151 enables a necessary frequency band of the tester 100 to be limited, and the data DQ is sampled by use of those frequency-divided clocks in the respective DQ measurement systems.

Figure 4:
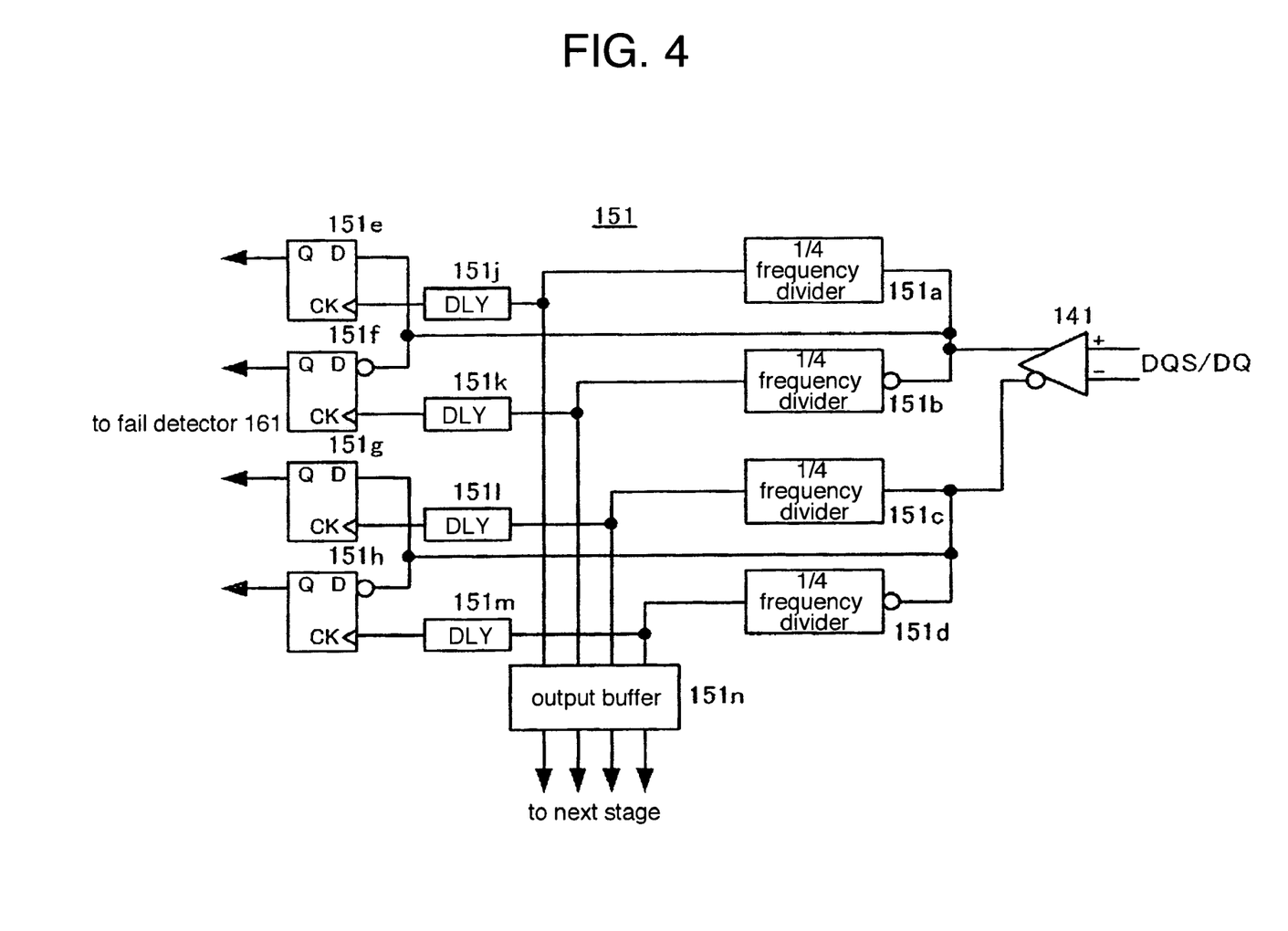
FIG. 4 is a block diagram showing a specific example of a frequency dividing-distribution unit 151.

FIG. 4 is a block diagram showing a specific example of the frequency dividing-distribution unit 151, and in the figure, parts corresponding to those in FIGS. 1 and 3, respectively, are denoted by like reference numerals. A noninverting output of the receiver 141, while being inputted to a noninverting ¼ frequency divider 151a, and an inverting ¼ frequency divider 151b, is inputted to a noninverting input terminal D of a flip-flop 151e, and an inverting input terminal D of a flip-flop 151f. An inverting output of the receiver 141, while being inputted to a noninverting ¼ frequency divider 151c, and an inverting ¼ frequency divider 151d, is inputted to a noninverting input terminal D of a flip-flop 151g, and an inverting input terminal D of a flip-flop 151h.

An output of the noninverting ¼ frequency divider 151a, while being inputted to a clock terminal of the flip-flop 151e via a variable delay element 151j, is inputted to an output buffer 151n, an output of the inverting ¼ frequency divider 151b, while being inputted to a clock terminal of the flip-flop 151f via a variable delay element 151k, is inputted to the output buffer 151n, an output of the noninverting ¼ frequency divider 151c, while being inputted to a clock terminal of the flip-flop 151g via a variable delay element 151l, is inputted to the output buffer 151n, and an output of the inverting ¼ frequency divider 151d, while being inputted to a clock terminal of the flip-flop 151h via a variable delay element 151m, is inputted to the output buffer 151n.

Respective Q outputs of the flip-flops 151e to 151h are inputted to the fail detector 161.

By the agency of respective delay time (lengths) of the variable delay elements 151j to 151m, provided in the frequency divide-distribution unit 151, it is possible to set relative delay time of the data DQ against the DQS, as defined by the DUT 200. In this case, since the output of the DUT 200 is used as the clock for sampling, even if the DQS as the clock frequency is assumed to undergo variation owing to reasons on the part of the DUT 200, there will occur no variation in relation thereof with the resultant data DQ, so that it is possible to stably acquire the data DQ.

Further, for the distribution units 152 to 15n, use may be made of a semiconductor chip having a configuration identical to that for the frequency dividing-distribution unit 151, thereby making use of only a distribution function thereof.

Figure 5:
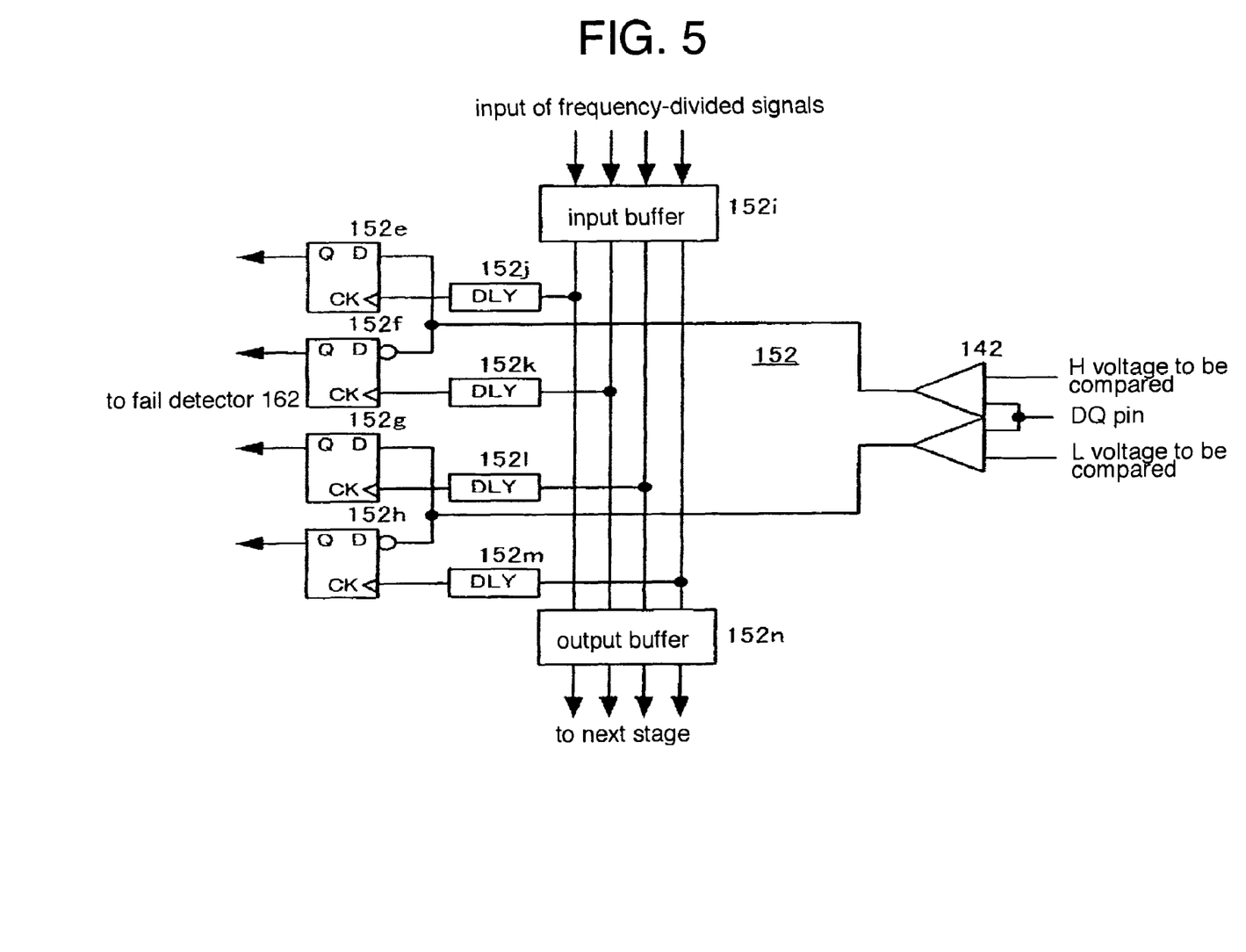
FIG. 5 is a block diagram showing a specific example of a distribution unit 152.

FIG. 5 is a block diagram showing a specific example of the distribution unit 152, and in the figure, parts corresponding to those in FIGS. 1 and 3, respectively, are denoted by like reference numerals. In FIG. 5, an output on an upper limit H side of the comparator 142 is inputted to a noninverting input terminal D of a flip-flop 152e, and an inverting input terminal D of a flip-flop 152f while an output on a lower limit L side of the comparator 142 is inputted to a noninverting input terminal D of a flip-flop 152g, and an inverting input terminal D of a flip-flop 152h.

Frequency-divided signals from the output buffer 151n of the frequency divide-distribution unit 151 are inputted to an input buffer 152i, and those frequency-divided signals are outputted to an input buffer in the next stage via an output buffer 152n. The output of the noninverting ¼ frequency divider 151a, while being inputted to a clock terminal of a flip-flop 152e via a variable delay element 152j, is inputted to the output buffer 152n, the output of the inverting ¼ frequency divider 151b, while being inputted to a clock terminal of a flip-flop 152f via a variable delay element 152k, is inputted to the output buffer 152n, the output of the noninverting ¼ frequency divider 151c, while being inputted to a clock terminal of a flip-flop 152g via a variable delay element 152l, is inputted to the output buffer 152n, and the output of the inverting ¼ frequency divider 151d, while being inputted to a clock terminal of a flip-flop 152h via a variable delay element 152m, is inputted to the output buffer 152n.

Respective Q outputs of the flip-flops 152e to 152h are inputted to the fail detector 162.

By the agency of respective delay time of the variable delay elements 152j to 152m, provided in the distribution unit 152, it is possible to set relative delay time of the data DQ against the DQS, as defined by the DUT 200. In this case, since the output of the DUT 200 is used as the clock for sampling, even if the DQS as the clock frequency is assumed to undergo variation owing to reasons on the part of the DUT 200, there will occur no variation in relation thereof with the resultant data DQ, so that it is possible to stably acquire the data DQ.

Figure 6:
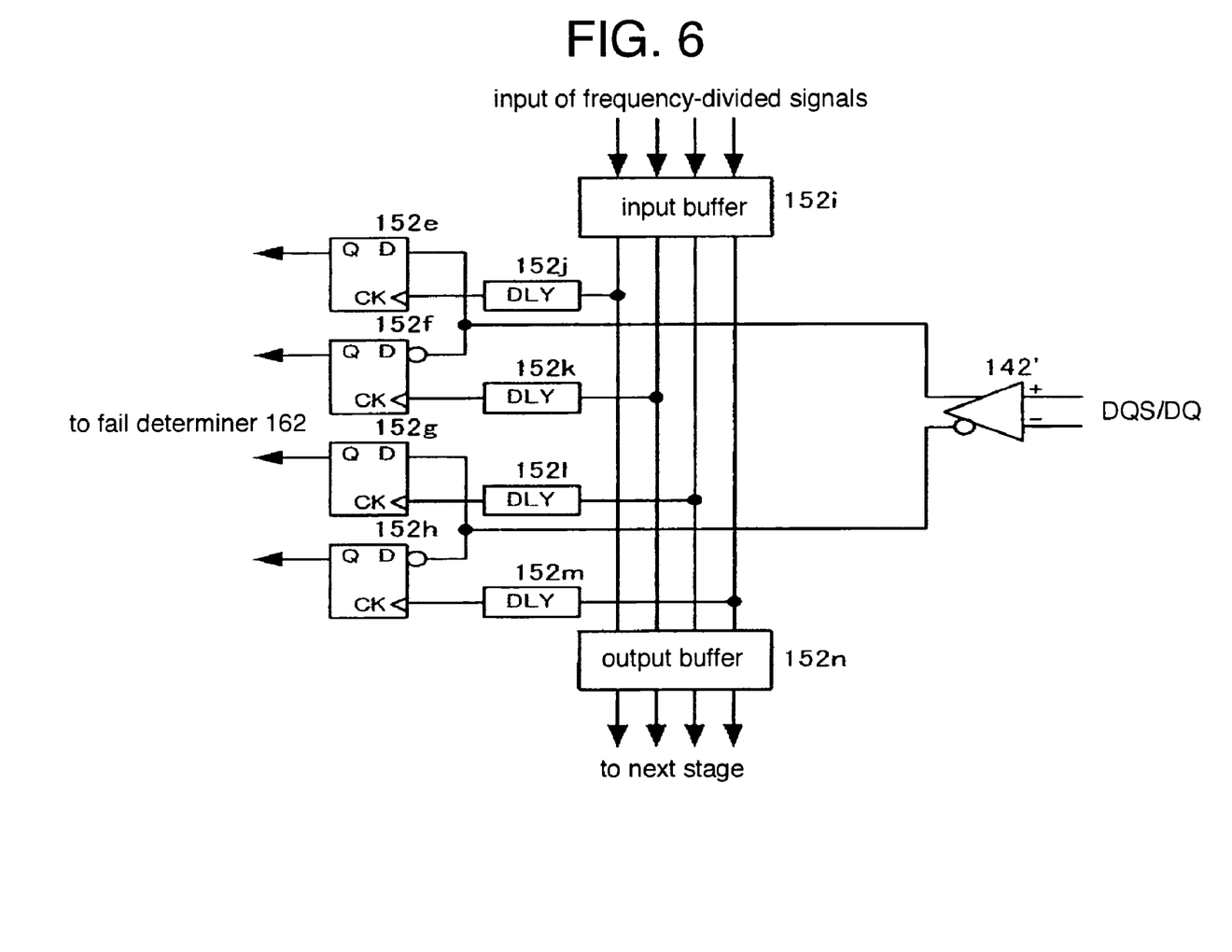
FIG. 6 is a block diagram showing another example of the distribution unit 152.

In FIG. 5, there is shown the example wherein the output data DQ of the DUT 200 is inputted via the window-type comparator 142, however, as shown in FIG. 6, the output data DQ of the DUT 200 may be inputted via a receiver 142' of a differential configuration, similar to that shown in FIG. 4, in particular usage.

Figure 7:
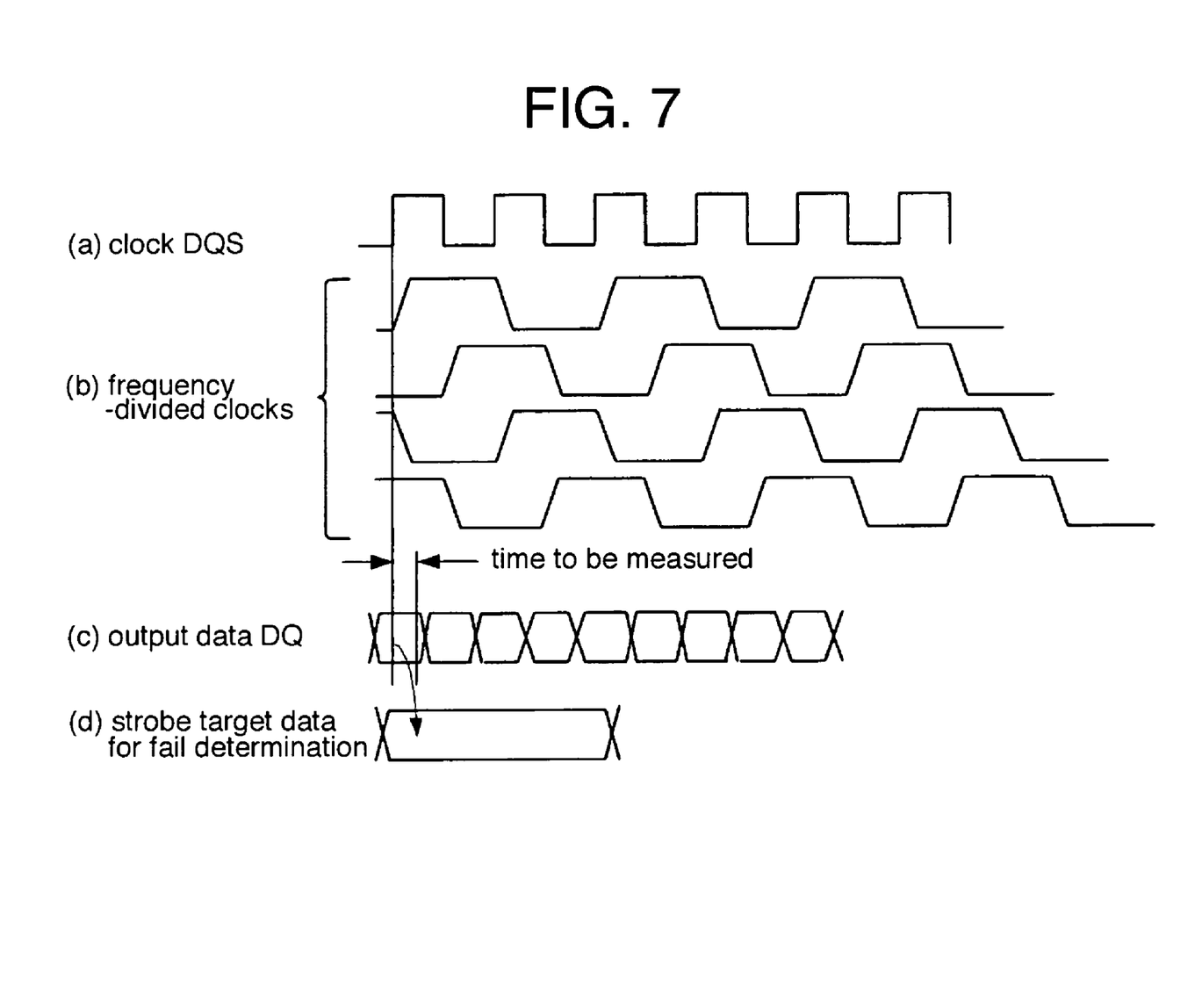
FIG. 7 is a timing chart for describing operation in FIG. 4.

FIG. 7 is a timing chart for describing operation in FIG. 4. Symbol (a) indicates the clock DQS generated in the DUT, (b) indicates the frequency-divided clocks obtained by ¼ frequency dividing the clock DQS, (c) indicates the data DQ outputted from the DUT 200, and (d) indicates strobe target data for fail detection by the respective flip-flops 151e to 151h. As shown in FIG. 7, four clocks are held as the target data for fail detection.

By so doing, it becomes possible to implement a tracking function whereby the data DQ can be correctly turned into a strobe at all times as long as a relative relationship of the clock DQS with the data DQ is maintained even if the clock DQS outputted from the device undergoes variation.

Further, the need for measurement of arriving clocks, detection of displacement thereof, reprogramming of timing, as with the conventional tester, can be eliminated at the time of programming for a tester, and it is possible to program according to parameters of a device.

With the embodiment of the invention, described hereinbefore, there has been described the case where the clock is frequency-divided, however, the clock as it is, without being frequency-divided, may be distributed to necessary pins inside the tester.

Further, for the variable delay element, use may be made of a PLL following up, and being in sync with the clock, thereby controlling delay of the data by use of a control voltage of the PLL.

Still further, a minuscule time interval measurement means, such as a time interval analyzer, and so forth, may be used for measurement of timing values of the clock, and on the basis of results of such measurement, follow-up control may be executed.

As described in the foregoing, with the invention, even if a change occurs in frequency and propagation delay due to effects of environmental conditions of the device, such as the circuit noises, variation in power supply, device temperature, and so forth, as previously described, it is possible to acquire the data on the part of the tester without executing complicated operation whereby strobe positions are detected as required in the past, and all sampling timings of the data are worked out to be then reset, so that it is possible to implement a semiconductor memory tester capable of efficiently conducting a test on a fast memory while using specification values of the device as they are.

What is claimed is:

1. A semiconductor memory tester for determining pass or fail on a memory device under test, said semiconductor memory tester comprising:
   a measurement division having a plurality of timing generators, said measurement division for comparing an output from the memory device under test with an expected value at timing on the basis of a clock outputted by the memory device under test;
   wherein the measurement division comprises:
   comparators for receiving output data of the memory device under test, respectively,
   sampling units for sampling respective outputs from the corresponding comparators on the basis of a timing for comparison, and
   fail detectors for comparing respective outputs of the sampling units with the expected value at the timing signal outputted by the respective one of the plurality of the timing generators before determining pass or fail on the memory device under test.

2. The semiconductor memory tester according to claim 1, wherein the measurement division comprises variable delay elements for setting delay time clocking of the output data of the memory device under test, respectively.

3. The semiconductor memory tester according to claim 1, wherein the measurement division comprises a frequency dividing means for frequency-dividing the clock outputted by the memory device under test to thereby generate the timing for the comparison.

4. The semiconductor memory tester according to claim 1, wherein the memory device under test internally generates the clock.

* * * * *